United States Patent
Cheng et al.

(10) Patent No.: US 9,162,188 B2
(45) Date of Patent: Oct. 20, 2015

(54) METHODS FOR CLEANING MEMBRANES USED FOR FILTERING CHEMICALS

(71) Applicant: Taiwan Semiconductor Manufacturing Company, Ltd., Hsin-Chu (TW)

(72) Inventors: Ya-Ling Cheng, Yilan (TW); Ching-Yu Chang, Yilang County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 161 days.

(21) Appl. No.: 13/966,981

(22) Filed: Aug. 14, 2013

(65) Prior Publication Data

US 2015/0050598 A1    Feb. 19, 2015

(51) Int. Cl.
  *G03F 7/00* (2006.01)
  *B01D 65/02* (2006.01)

(52) U.S. Cl.
  CPC *B01D 65/02* (2013.01); *G03F 7/00* (2013.01); *B01D 2315/02* (2013.01); *B01D 2321/02* (2013.01); *B01D 2321/04* (2013.01); *B01D 2321/162* (2013.01); *B01D 2321/164* (2013.01); *B01D 2321/168* (2013.01); *B01D 2321/2033* (2013.01); *B01D 2321/2075* (2013.01); *B01D 2321/2083* (2013.01)

(58) Field of Classification Search
  CPC . G03F 7/0045; G03F 7/0392; G03F 7/70916; G03F 7/004; G03F 7/70908; B01D 35/02; B01D 24/22; B01D 19/0031; B01D 2311/2649; B01D 65/02
  USPC .................. 430/322; 210/636; 134/1
  See application file for complete search history.

(56) References Cited

U.S. PATENT DOCUMENTS 7,264,912 B2 * 9/2007 Hioki et al. ................ 430/270.1

FOREIGN PATENT DOCUMENTS

DE    4210531    * 10/1993

OTHER PUBLICATIONS

Braggin, J., et al., "Defect performance of a 2X node resist with a revolutionary point-of-use filter," Proc. of SPIE vol. 7639, Advances in Resist Materials and Processing and Technology XXVII, Mar. 30, 2010, 8 pgs.
http://en.wikipedia.org/wiki/Hansen_solubility_parameter, "Hansen solubility parameter," From Wikipedia, dowloaded Aug. 14, 2013, 4 pgs.
http://en.wikipedia.org/wiki/Solvent, "Solvent," From Wikipedia, downloaded Aug. 14, 2013, 15 pgs.

(Continued)

*Primary Examiner* — Caleen Sullivan
(74) *Attorney, Agent, or Firm* — Slater & Matsil, L.L.P.

(57) ABSTRACT

A method includes performing a first cleaning step to clean a membrane, wherein during the first cleaning step, a first solvent passes through the membrane. After the first cleaning step, a second cleaning step is performed to clean the membrane. During the second cleaning step, a second solvent passes through the membrane. The first solvent and the second solvent are in different groups among three solvent groups, wherein the three solvent groups include a non-polar solvent group, a polar aprotic solvent group, and a polar protic solvent group.

20 Claims, 7 Drawing Sheets

(56) References Cited

OTHER PUBLICATIONS http://en.wikipedia.org/wiki/Surfactant, "Surfactant," From Wikipedia, downloaded Aug. 14, 2013, 10 pgs.

http://en.wikipedia.org/wiki/Wetting, "Wetting," From Wikipedia, downloaded Aug. 14, 2013, 12 pgs.

* cited by examiner

| SOLVENT | CHEMICAL FORMULA | δD DISPERSION | δP POLAR | δH HYDROGEN BONDING |
|---|---|---|---|---|
| NON-POLAR SOLVENTS | | | | |
| HEXANE | $CH_3\text{-}CH_2\text{-}CH_2\text{-}CH_2\text{-}CH_2\text{-}CH_3$ | 14.9 | 0.0 | 0.0 |
| BENZENE | $C_6H_6$ | 18.4 | 0.0 | 2.0 |
| TOLUENE | $C_6H_5\text{-}CH_3$ | 18.0 | 1.4 | 2.0 |
| DIETHYL ETHER | $CH_3CH_2O\text{-}CH_2\text{-}CH_3$ | 14.5 | 2.9 | 4.6 |
| CHLOROFORM | $CHCl_3$ | 17.8 | 3.1 | 5.7 |
| 1.4-DIOXANE | $/\text{-}CH_2\text{-}CH_2\text{-}O\text{-}CH_2\text{-}CH_2\text{-}O\text{-}\backslash$ | 17.5 | 1.8 | 9.0 |
| POLAR APROTIC SOLVENTS | | | | |
| ETHYL ACETATE | $CH_3\text{-}C(=O)\text{-}O\text{-}CH_2\text{-}CH_3$ | 15.8 | 5.3 | 7.2 |
| TETRAHYDROFURAN (THF) | $/\text{-}CH_2\text{-}CH_2\text{-}O\text{-}CH_2\text{-}CH_2\text{-}\backslash$ | 16.8 | 5.7 | 8.0 |
| DICHLOROMETHANE | $CH_2Cl_2$ | 17.0 | 7.3 | 7.1 |
| ACETONE | $CH_3\text{-}C(=O)\text{-}CH_3$ | 15.5 | 10.4 | 7.0 |
| ACETONITRILE (MeCN) | $CH_3\text{-}C\equiv N$ | 15.3 | 18.0 | 6.1 |
| DIMETHYLFORMAMIDE (DMF) | $H\text{-}C(=O)N(CH_3)_2$ | 17.4 | 13.7 | 11.3 |
| DIMETHYL SULFOXIDE (DMSO) | $CH_3\text{-}S(=O)\text{-}CH_3$ | 18.4 | 16.4 | 10.2 |
| POLAR PROTIC SOLVENTS | | | | |
| ACETIC ACID | $CH_3\text{-}C(=O)OH$ | 14.5 | 8.0 | 13.5 |
| n-BUTANOL | $CH_3\text{-}CH_2\text{-}CH_2\text{-}CH_2\text{-}OH$ | 16.0 | 5.7 | 15.8 |
| ISOPROPANOL | $CH_3\text{-}CH(\text{-}OH)\text{-}CH_3$ | 15.8 | 6.1 | 16.4 |
| n-PROPANOL | $CH_3\text{-}CH_2\text{-}CH_2\text{-}OH$ | 16.0 | 6.8 | 17.4 |
| ETHANOL | $CH_3\text{-}CH_2\text{-}OH$ | 15.8 | 8.8 | 19.4 |
| METHANOL | $CH_3\text{-}OH$ | 14.7 | 12.3 | 22.3 |
| FORMIC ACID | $H\text{-}C(=O)OH$ | 14.6 | 10.0 | 14.0 |
| WATER | $H\text{-}O\text{-}H$ | 15.5 | 16.0 | 42.3 |

FIG. 3

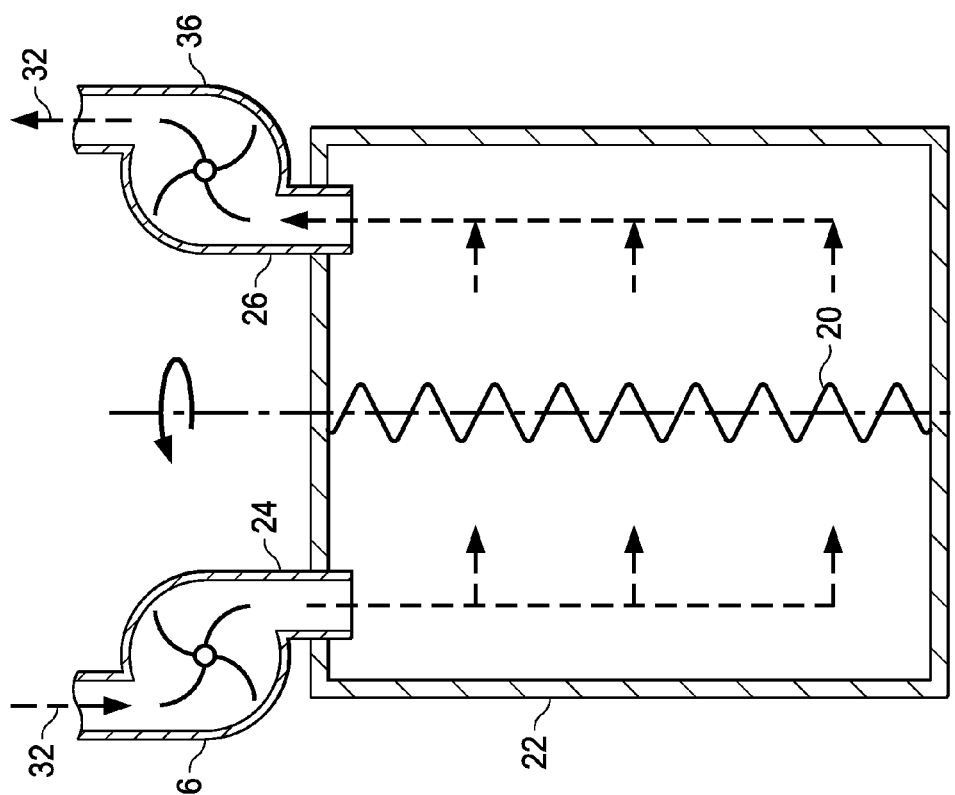
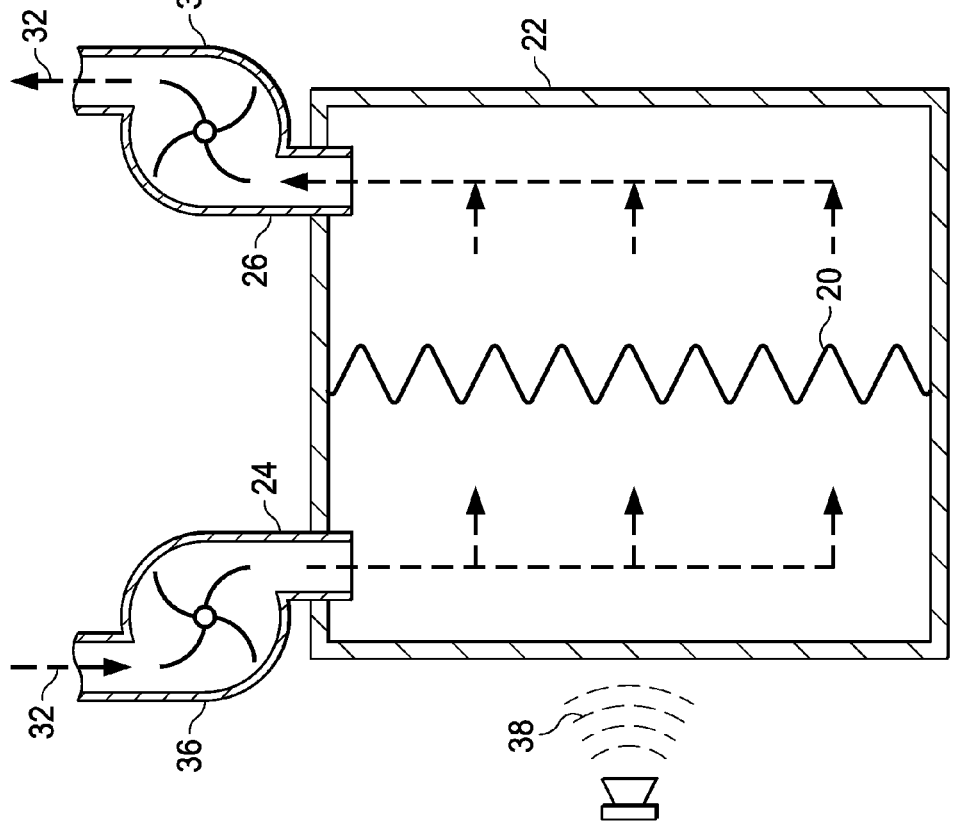

METHODS FOR CLEANING MEMBRANES USED FOR FILTERING CHEMICALS

BACKGROUND

The manufacturing of integrated circuits involves a plurality of process steps, in which a plurality of chemicals/materials is involved. Some of these chemicals are liquids. For example, the manufacturing of a chip may include many photolithography steps. In each of the photolithography steps, photo resists, Bottom Anti-Reflective Coating (BARC), and the like, are often used.

To improve the manufacturing yield, the chemicals may be filtered, so that the undesirable substances and particles in these chemicals may be removed before the chemicals are used in the manufacturing of integrated circuits. The filtering is performed using membranes, wherein the chemicals penetrate through the pores of the membranes, while the undesirable substances and particles, which have sizes greater than the pore sizes, are blocked. Since the membranes used for holding the membranes may contain undesirable impurities and chemicals themselves, the membranes need to be cleaned first before they are used, otherwise, the membranes become the source in contaminating the chemicals that are cleaned.

BRIEF DESCRIPTION OF THE DRAWINGS

For a more complete understanding of the embodiments, and the advantages thereof, reference is now made to the following descriptions taken in conjunction with the accompanying drawings, in which:

FIG. 3 illustrates a table, wherein a plurality of exemplary solvents is grouped into a non-polar solvent group, a polar aprotic solvent group, and a polar protic solvent group;

FIGS. 7 through 10 illustrate the cleaning of a membrane in accordance with some exemplary embodiments, wherein different physical forces are used in the cleaning;

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A method for cleaning membranes and the housings that are used for cleaning chemicals are provided in accordance with various exemplary embodiments. The intermediate stages of the cleaning processes are illustrated. The variations of the embodiments are discussed. Throughout the various views and illustrative embodiments, like reference numbers are used to designate like elements.

Figure 1:
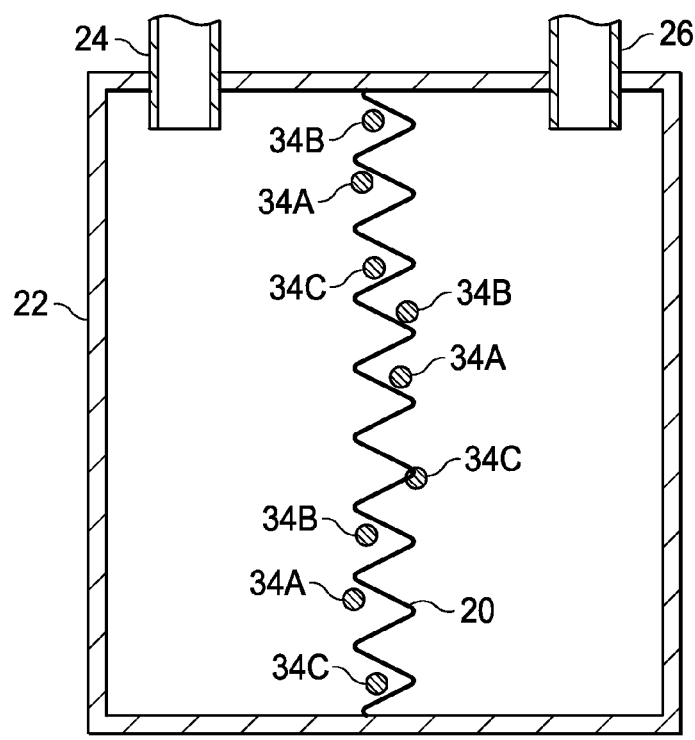
FIG. 1 illustrates a membrane and a housing holding the membrane in accordance with some alternative exemplary embodiments.

FIG. 1 schematically illustrates a cross-sectional view of membrane 20, which is installed in (membrane) housing 22. Membrane 20 may be an Ultra-high molecular weight Poly-Ethylene (UPE) membrane in some embodiments, although it may also be another type of membrane. Membrane 20 comprises pores (not shown), and is configured to allow chemicals with sizes smaller than the pore sizes to pass through, and block the flowing of substances with sizes greater than the pore sizes.

Housing 22 includes a shell. Inlet 24 and outlet 26 connect the inner spaces in the shell to external environment. Membrane 20 separate the inner space of housing 22 into two portions, wherein inlet 24 is connected to the first portion, and the outlet 26 is connected to the second portion. Accordingly, when a chemical (for example, a fluid or a gas) is injected into the first portion of housing 22 through inlet 24, the chemical may penetrate through the pores in membrane 20 and reach the second portion, which is connected to outlet 26. The chemical is retrieved through outlet 26. In this process, the chemical is filtered by membrane 20. It is appreciated that FIG. 1 illustrates an exemplary shape for disposing membrane 20 in housing 22, while other settings different from illustrated may also be used.

Figure 2:
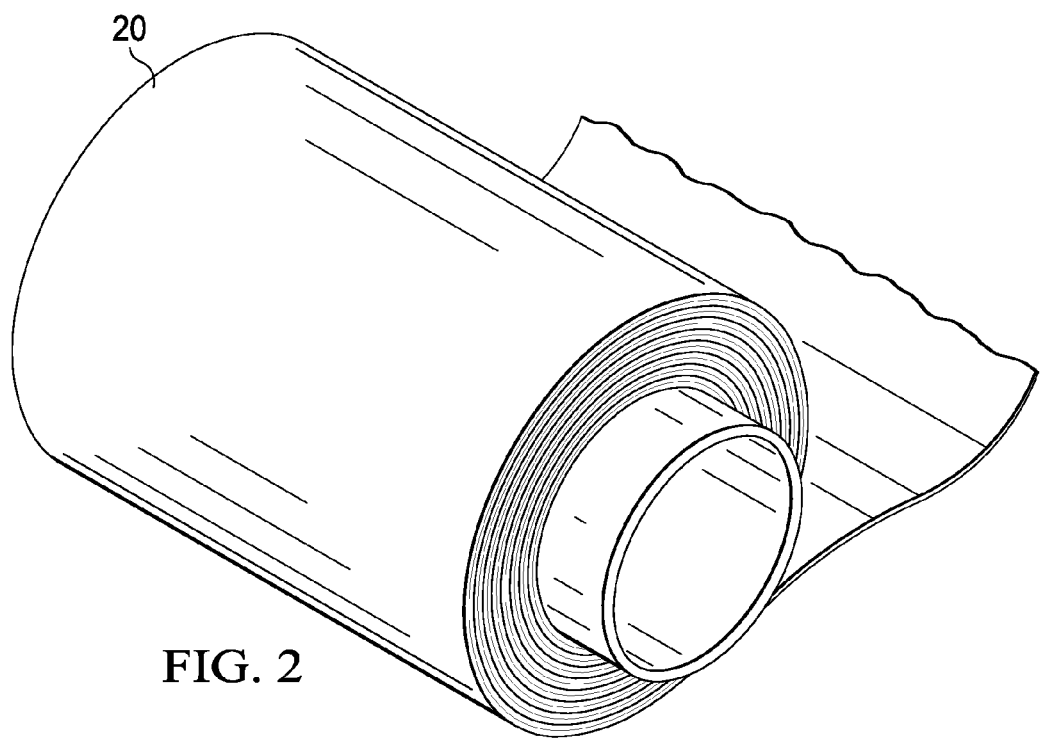
FIG. 2 illustrates a roll of an exemplary membrane in accordance with some exemplary embodiments.

FIG. 2 illustrates an exemplary membrane 20 before it is installed in housing 22. In the illustrated example, membrane 20 may be a film, which may be rolled on a roller. When installed in housing 22, as shown in FIG. 1, membrane 20 may be curled to increase its area for filtering, although membrane 20 may also be installed as a flat sheet.

Referring back to FIG. 1, assuming that impurities 34 (include 34A, 34B, and 34C) are attracted on membrane 20, membrane 20 needs to be cleaned, and impurities 34 removed, before membrane 20 and housing 22 is used for filtering. Impurities 34A, 34B, and 34C may be different impurities that have different characteristics. For example, impurities 34A, 34B, and 34C may have different dispersion bonding values, different polar bonding values, and/or different hydrogen bonding values. Due to the difference in properties, each of impurities 34A, 34B, and 34C may be soluble, and can be removed from membrane 20, by some cleaning solvents, but not by others. To remove different types of impurities efficiently, a plurality of solvents that has different properties may be used to clean the same membrane 20.

The table illustrated in FIG. 3 illustrates some candidate solvents that can be used. The solvents are grouped in accordance with their inter-molecule force properties, and are grouped as non-polar solvents, polar aprotic solvents, and polar protic solvents. Polar solvents may apply strong intermolecular forces to impurity particles through polar force or hydrogen bonding between the solvent polymer and the impurity. The polar solvents include polar groups, which may be selected from, and are not limited to, hydroxyl group (—OH), carbonyl group (C═O), ether (R—O—R'), esters (RCOOR'), amine (R—NH$_2$), amides (R—COHN$_2$), and carboxylic (—COOH). A polar solvent can be a single solvent or a co-solvent. The co-solvent includes two or more solvents, which may be selected from, and are not limited to, propyl ether, ethyl ether, butyl acetate, ethyl acetate, methyl ethyl ketone, acetone, aniline, cyclohexanone, Propylene Glycol Monomethyl Ether (PGME), and the like.

The non-polar solvents may apply strong inter-molecular forces to impurity particles through dispersion forces between the solvent polymer and the impurity. The non-polar solvents may include non-polar groups, selected from, and not limited to, alkanes (R—H), cyclic alkanes, branch alkanes, aromatics (Ar—H), alkyl halides (R—X), and the like. A non-polar solvent may be a single solvent or a co-solvent that includes two or more solvents selected from, and not limited to, pentane, octane, hexane, cyclohexane, isooctane, trimethylpentane, heptane, toluene, xylene, benzene, and the like.

In the examples shown in Table 3, the non-polar solvents include Haxane, Benzene, Toluene, Diethyl ether, Chloroform, 1,4-dioxane, and the like. The polar aprotic solvents include, for example, ethyl acetate, tetrahydrofuran, dichloromethane, acetone, acetonitrile, dimethylformamide, dimethyl sulfoxide, and the like. The polar protic solvents include, for example, acetic acide, n-butanol, isopropanol, n-propanol, ethanol, methanol, formic acid, water, and the like. In accordance with some embodiments, the non-polar solvents have polar bonding values smaller than about 5, and hydrogen bonding values smaller than about 10. The polar aprotic solvents have polar bonding values greater than about 5, and hydrogen bonding values smaller than 12. The polar protic solvents have polar bonding values greater than about 5, and hydrogen bonding values greater than 12. Each group of solvents is suitable for dissolving, and removing, impurities that have inter-molecule force properties similar to its own. For example, the non-polar solvents are more suitable for removing from membrane 20 (FIG. 1) the impurities with low polar values and low hydrogen bonding values, and are less suitable for removing from membrane 20 the impurities with high polar values and/or high hydrogen bonding values. On the contrary, the polar protic solvents are more suitable for removing from membrane 20 the impurities with high polar values and high hydrogen bonding values, and are less suitable for removing from membrane 20 the impurities with low polar values and/or low hydrogen bonding values. The polar aprotic solvents are more suitable for removing from membrane 20 the impurities with high polar values and low hydrogen bonding values, and are less suitable for removing from membrane 20 the impurities with high polar values and high hydrogen bonding values. Furthermore, the polar aprotic solvents are also less suitable for removing from membrane 20 the impurities with low polar values and low hydrogen bonding values.

The solvents may also be characterized by their surface tension values. With the lithography becomes more and more aggressive to smaller dimensions, the pore size of membrane 20 may shrink to achieve better defect reduction. Membrane's polymer chains hence become more difficult to be wetted by the cleaning solvents that are used for cleaning membranes.

In the embodiments of the present disclosure, solvents with low surface tension values in a range between about 20 dyne/cm and about 35 dyne/cm may be used. The solvents with different surface tension values may be used in different cleaning steps, for example, the earlier cleaning steps may be performed using the solvents with lower surface tensions, and the later cleaning steps may be performed using solvents with increasingly higher surface tensions.

The wettability of membrane 20 (FIG. 1) is related to the surface tension of the solvents, and membrane 20 is more wettable to the solvents with smaller surface tension values than to the solvents with greater surface tension values. The solvents with small surface tension values may spread easily on membrane surface. Accordingly, the very first solvent used in the cleaning of membrane 20 (FIG. 1) may have a surface tension value smaller than about 30 dyne/cm, which may also be close to 20 dyne/cm. The difference between the surface tension values of sequentially used solvents may be greater than 10 dyne/cm. The difference may also be in the range between about 5 dyne/cm and about 15 dyne/cm. By adopting this method, the solvents with smaller surface tension values may be used to wet membrane 20 first, and then the already-wet membrane 20 is wettable to the solvents with greater surface tension values. The efficiency in the cleaning of membrane 20 is thus enhanced.

Water has a high surface tension value of 72 dyne/cm, and has higher contact angle to membrane surface. Acetone, on the other hand, has a low surface tension value of 23 dyne/cm, and its low surface tension provides a low contact angle with porous membrane, which may result in better priming of the porous membrane. In some embodiments, surfactants may be added into the solvent to reduce the surface tension values of the solvents. The surfactants may be selected from, and are not limited to, octaethylene glycol monododecyl ether, pentaethylene glycol monododecyl ether, perfluorooctanesulfonate, perfluorononanoate, perfluorooctanoate, and the like.

In addition, in accordance with some embodiments, a desirable electrostatic potential may be generated on the membrane surface (of membrane 20) during the cleaning. For example, the membrane surface exhibits a negative electrostatic potential in basic solutions (with pH>7 or pH>8, for example) and a positive electrostatic potential in acidic solutions (with pH<7 or pH<6) due to the adsorption of hydroxyl (positively charged H+) or hydronium ions (negative charged OH—). Accordingly, by controlling the electrostatic effect of membrane surface through the selection of cleaning solvents, desirable positive or negative charges may be accumulated on surfaces of membrane 20 (FIG. 1) in the cleaning process. The accumulated charges generate a repulsive force to like-charged impurities, and hence these impurities do not adhere back to membrane 20. The efficiency of cleaning may thus be improved. For example, when ammonium water is applied to flush membrane 20, membrane 20 will be charged to a negative potential by OH— ions. As a result, negatively charge impurity particles will be prevented from being attached to membrane 20 again.

Figure 4:
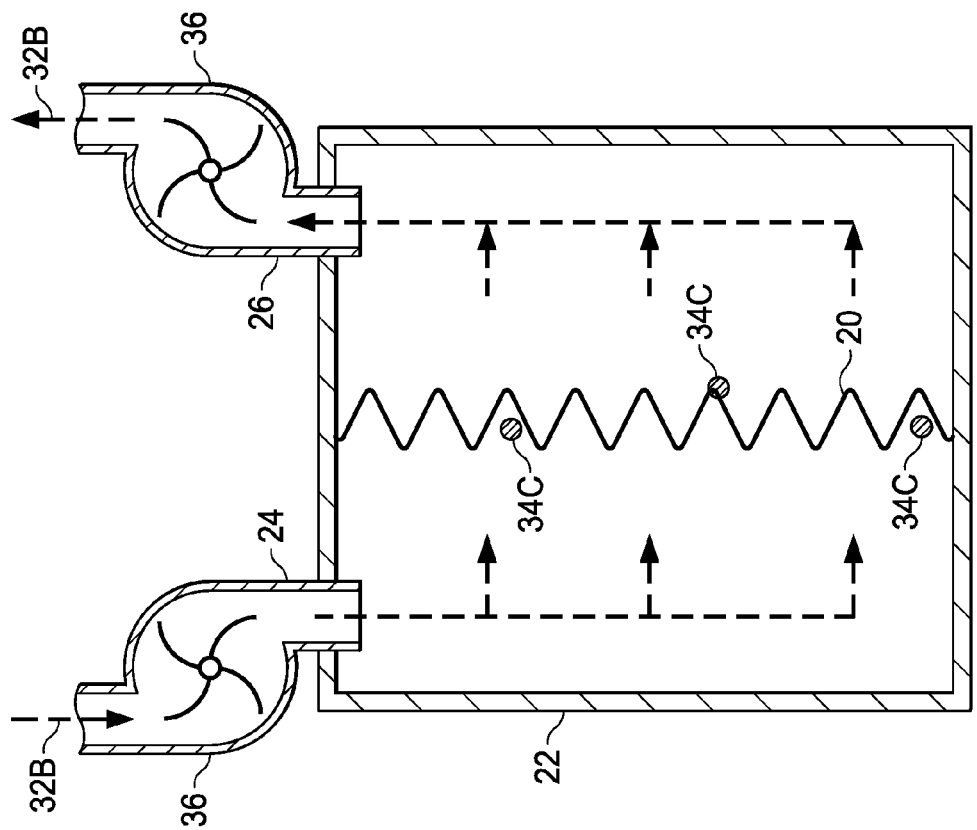
FIGS. 4 through 6 are cross-sectional views of intermediate stages in the cleaning of a membrane in accordance with some exemplary embodiments, wherein solvents selected from different solvent groups are used sequentially in the cleaning.
Figure 5:
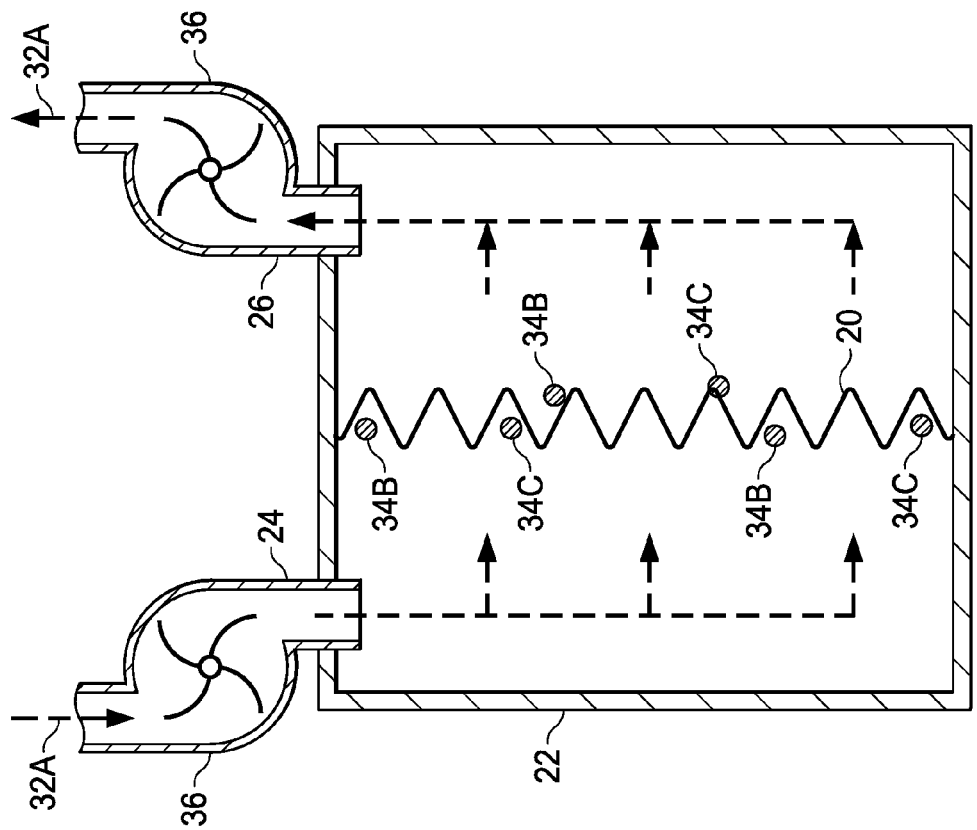
Figure 6:
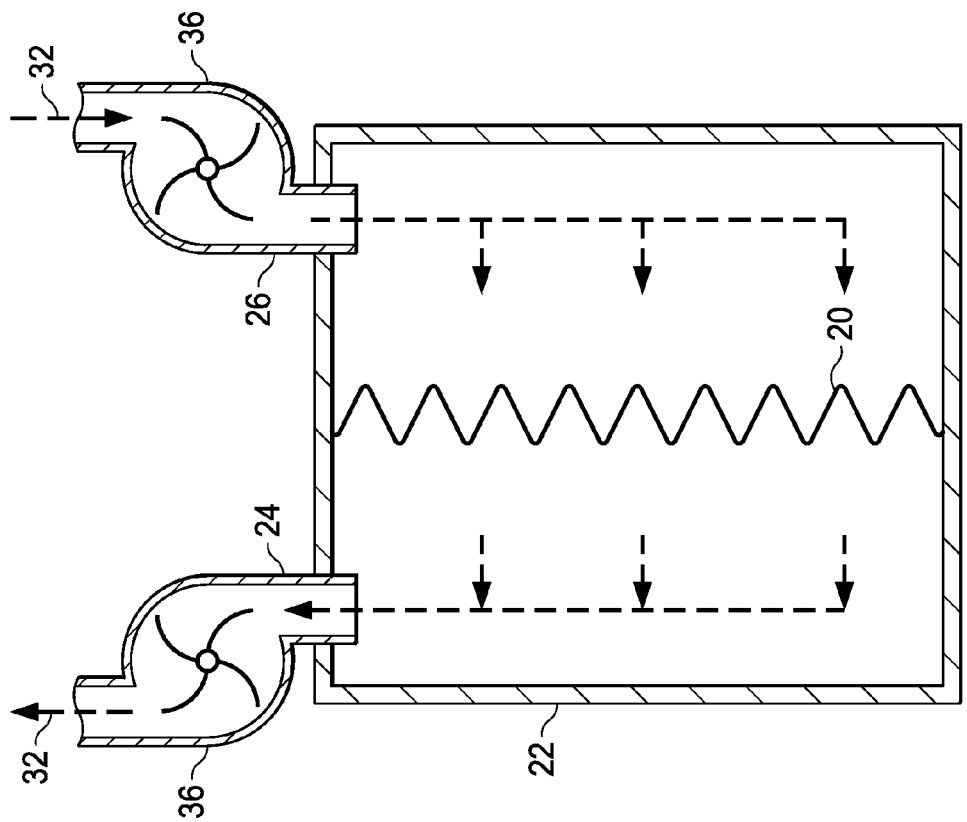

FIGS. 4 through 6 illustrate intermediate stages in the cleaning of membrane 20 in accordance with some embodiments. In an initial stage, membrane 20 and housing 22 as in FIG. 1 are provided, wherein impurities 34A, 34B, and 34C may exist, which impurities are to be removed in subsequent cleaning steps. Referring to FIG. 4, solvent 32A is injected into inlet 24 of housing 22, and retrieved from outlet 26. The rejection and the retrieval may be achieved through pumps 36, for example. Solvent 32A has inter-molecular force properties close to that of impurity 34A (FIG. 1), accordingly, impurities 34A are dissolved in solvent 32A, and are removed from membrane 20 and housing 22 along with solvent 32A. The inter-molecular force properties of solvent 32A are different from that of impurities 34B and 34C, and hence a substantial amount of impurities 34B and 34C remain not removed.

Next, referring to FIG. 5, solvent 32B is injected into inlet 24 of housing 22, and retrieved from outlet 26. Solvent 32B has inter-molecular force properties close to that of impurity 34B (FIG. 4), accordingly, impurities 34B are dissolved in solvent 32B, and are removed from membrane 20 and housing 22 along with solvent 32B. The inter-molecular force properties of solvent 32B are different from that of impurity 34C, and hence a substantial amount of impurities 34C remain not removed.

Next, Referring to FIG. 6, solvent 32C is injected into inlet 24 of housing 22, and retrieved from outlet 26. Solvent 32C has inter-molecular force properties close to that of impurity 34C (FIG. 5), accordingly, impurities 34C are dissolved in solvent 32C, and are removed from membrane 20 and housing 22 along with solvent 32C.

In accordance with some embodiments, each of solvents 32A, 32B, and 32C is selected from one of the groups among non-polar solvents, polar aprotic solvents, and polar protic solvents, with at least two (and possibly three) of the solvents 32A, 32B, and 32C belonging to different groups. Accordingly, non-polar impurities, polar aprotic impurities, and polar protic impurities may be removed by non-polar solvents, polar aprotic solvents, and polar protic solvents, respectively. The non-polar solvents, polar aprotic solvents, and polar protic solvents, however, may be using in the cleaning steps in any order.

To maximize the cleaning ability, the inter-molecular force properties of solvents 32A, 32B, and 32C may have differences that are significant enough, so that a wide range of impurities may be removed using a limited number of solvents. In some embodiments, in the cleaning process, the polar bonding values of the solvent in the polar aprotic solvents and polar protic solvents may be greater than the polar bonding values of the non-polar solvents by a difference greater than about 5, or greater than about 10. Furthermore, the hydrogen bonding values of the solvents in the polar aprotic solvents may be greater than the hydrogen bonding values of the non-polar solvents by a difference greater than about 5. The hydrogen bonding values of the solvents in the polar protic solvents may be greater than the hydrogen bonding values of the polar aprotic solvents by a difference greater than about 5, or greater than about 10.

Figure 7:
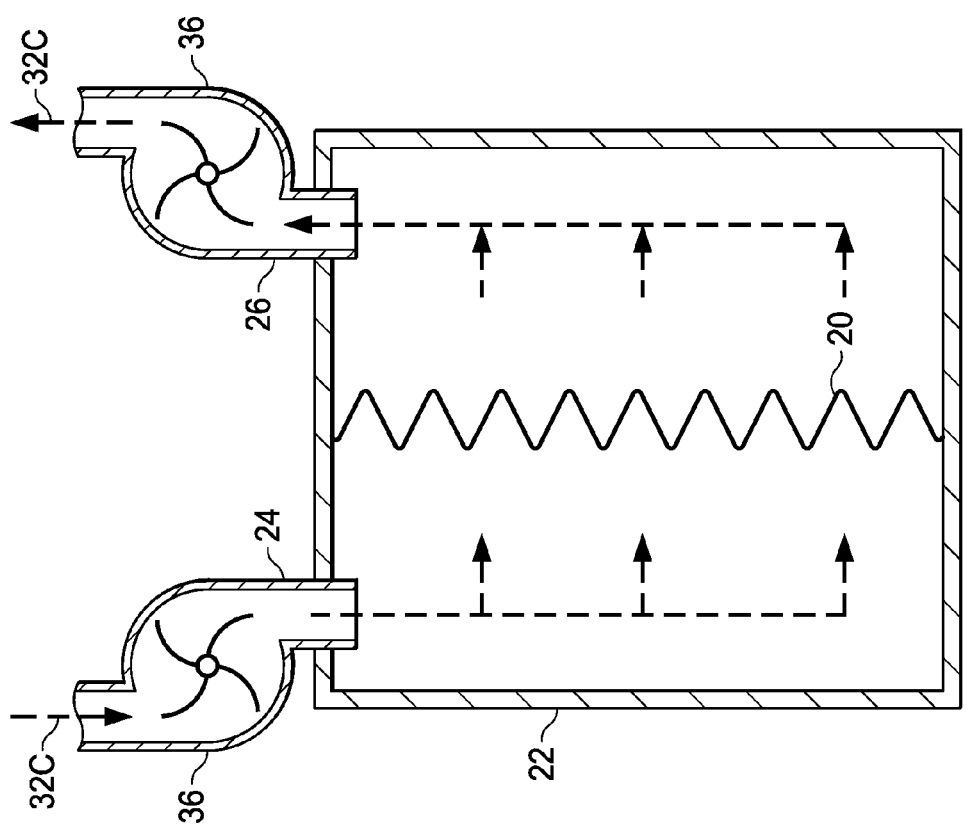

FIGS. 7 through 10 illustrate the cleaning process in accordance with some embodiments, which embodiments include physical cleaning processes. Referring to FIG. 7, solvent 32 is injected into housing 22 through outlet 2, and retrieved out of housing 22 through inlet 24. Accordingly, the flowing direction of solvent 32 in FIG. 7 is opposite to the flowing direction of solvent 32A in FIG. 4. Solvents 32 and 32A may be the same type of solvent, or may be different types of solvents. A two-way cleaning may thus be performed by performing both the step in FIG. 4 and the step in FIG. 7. The two-way cleaning may results an increase in the efficiency in the removal of the impurities.

FIG. 8 illustrates an exemplary cleaning process, in which ultra-sonic 38 is applied on solvent 32 in housing 22. The ultrasonic results in the increase in the possibility of collision between the molecules of solvent 32 and impurities 34 (FIG. 1) and membrane 20, so that the impurity in membrane 20 can be flushed out. In some embodiments, ultra-sonic 38 is applied when solvent 32 continuously flow through membrane 20. In alternative embodiments, ultra-sonic 38 is applied to solvent 32 held in housing 22 when solvent 32 stops flowing. After the application of ultra-sonic 38, solvent 32 is flushed out.

FIG. 9 illustrates an exemplary cleaning process, in which a centrifuge force is applied on solvent 32 in housing 22. The centrifuge force may be applied by spinning housing 22, for example, with a rotation rate between about 4,000 rotations/minute and about 20,000 rotations/minute. The rotation may be started after solvent 32 is injected into housing 22, and membrane 20 is wetted. During the rotation, membrane 20 is dried through the rotation, wherein solvent 32 and the impurity are spun off membrane 20. With the centrifuge force being applied, the efficiency of impurity removal is also improved.

Figure 10:
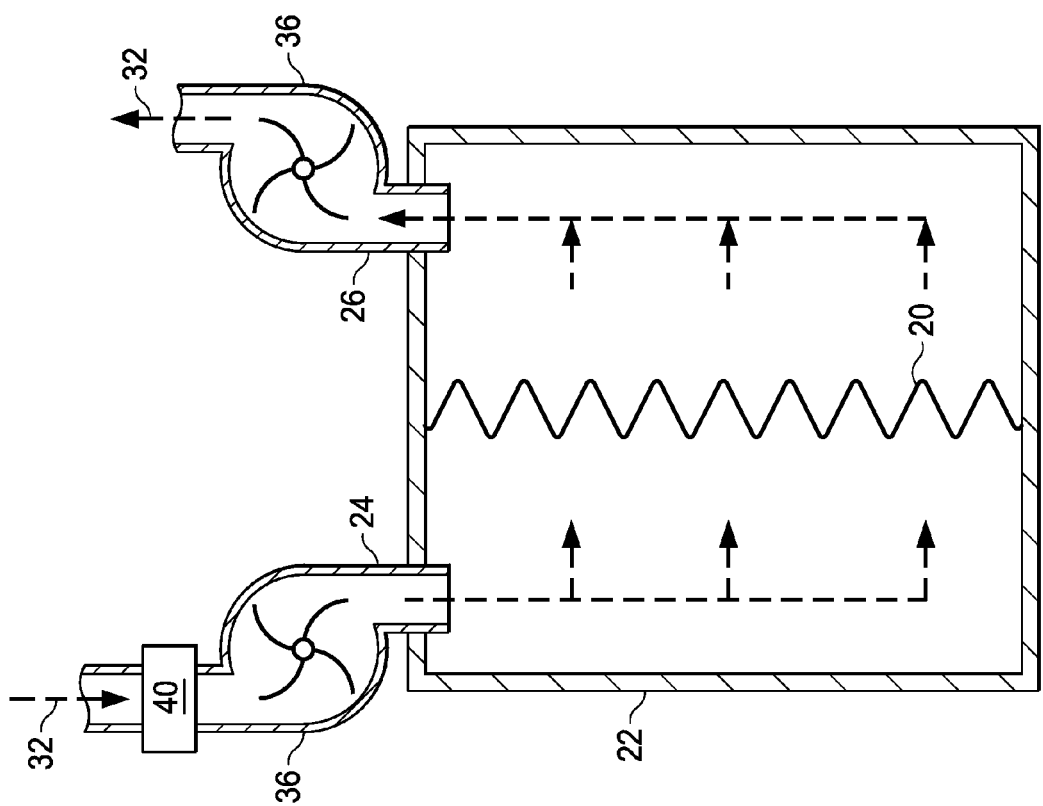

FIG. 10 illustrates the cleaning of membrane 20 and housing 22 using heated solvents. Increasing the temperature of the solvent for cleaning membrane and housing can improve dissolving performance. In accordance with some embodiments, the temperature of solvent 32 is increased to higher than about 25° C., and possibly between about 25° C. and 80° C. (depending on the type of solvent used), during the cleaning of membrane 20 and housing 22. The heating of solvent 32 may be achieved using heater 40, wherein solvent 32 is heated when passing through heater 40.

In addition, the efficiency in the cleaning may be increased by sealing inlet 24 and outlet 26, and any other inlet/outlet of housing 22 after solvent 32 is disposed into housing 22 (FIG. 1). After the sealing of the inlets and outlets of housing 22, the pressure in housing 22 may be increased, for example, to a range between about 0.2 atmospheres and about 2 atmospheres. This also increases the efficiency in the removal of impurities 34A, 34B, and 34C.

In accordance with some embodiments, two or more of the previously discussed methods including what are shown in FIGS. 4 through 10 may be combined to clean membrane 20. Combining the advantageous feature of solvents with different inter-molecular force properties, different surface tensions, different pH values, and increased temperatures, some exemplary cleaning processes may be performed, as will be discussed below.

In some exemplary embodiments, the sequentially applied solvents include a first solvent with a low-surface-tension around 20 dyne/cm, followed by a non-polar solvent, and followed by a polar solvent. In a subsequent step, an aqueous solution such as water may be used. The low-surface-tension may be selected from, and are not limited to, alkanes, ethers, esters, ketones, amines, and alcohols. For example, the low-surface-tension may include octane, Propylene Glycol Monomethyl Ether Acetate (PGMEA), and Propylene Glycol Monomethyl Ether (PGME). The low-surface-tension solvent may, or may not, include a surfactant therein. The surfactant may be an ionic or a non-ionic type surfactant. For example, the non-ionic surfactant may include octaethylene glycol monododecyl ether, and/or pentaethylene glycol monododecyl ether. The ionic surfactant may include, and is not limited to, perfluorooctanesulfonate, perfluorononanoate, and perfluorooctanoate. The non-polar solvents may be selected from, and are not limited to, alkanes, aromatics, ethers, and alkyl halides. For example, the non-polar solvents may include pentane, octane, hexane, cyclohexane, isooctane, trimethylpentane, heptane, toluene, xylene, benzene, and/or the like. The polar solvents may be selected from, and are not limited to, esters, aldehydes, ketones, and amines. For example, the polar solvents may include propyl ether, ethyl ether, butyl acetate, ethyl acetate, methyl ethyl ketone, acetone, aniline, cyclohexanone, and the like. The aqueous solution may be selected from alcohols, amides, carboxylic acids, and/or water. For example, the aqueous solution may comprise De-ionized (DI) water, ethylene glycol, methanol, dimethyl formamide, isopropyl alcohol, ethanol, propanol, isobutyl alcohol, butanol, ammonium hydroxide, and/or the like.

In some other exemplary embodiments, the cleaning is performed using hexane, followed by acetone, then finished by DI water. Hexane, which has non-polar property, help dissolve non-polar impurities, and its low surface tension help prime porous membrane, which is beneficial for the subsequent liquid flushing procedure. Acetone, which has a carbonyl group, has strong polar properties. Therefore, acetone helps attract polar impurities. The DI water has a rich hydrogen bonding property, which is good for dissolving impurities with hydrogen bonding acceptors. In these embodiments, the solvent amount may be in the range from about 10 times to about 200 times the volume of housing 22 (FIG. 1).

In yet other exemplary embodiments, the cleaning is performed using isooctane, acetone, methyl ethyl ketone, and ammonium water sequentially, then finished by DI water. Isooctane, due to its non-polar long alky chain, is good at attracting non-polar impurities. Acetone and methyl ethyl ketone, due to their high polar carbonyl groups, are good at attracting polar impurities. Ammonium hydroxide may help charge the surface of membrane 20 (FIG. 1) with its OH— ions, and hence negatively charged impurity particles are prevented from being re-attached to the cleaned membrane. In these embodiments, the solvent amount may be in the range from about 10 times to about 200 times the volume of housing 22 (FIG. 1).

Figure 11:
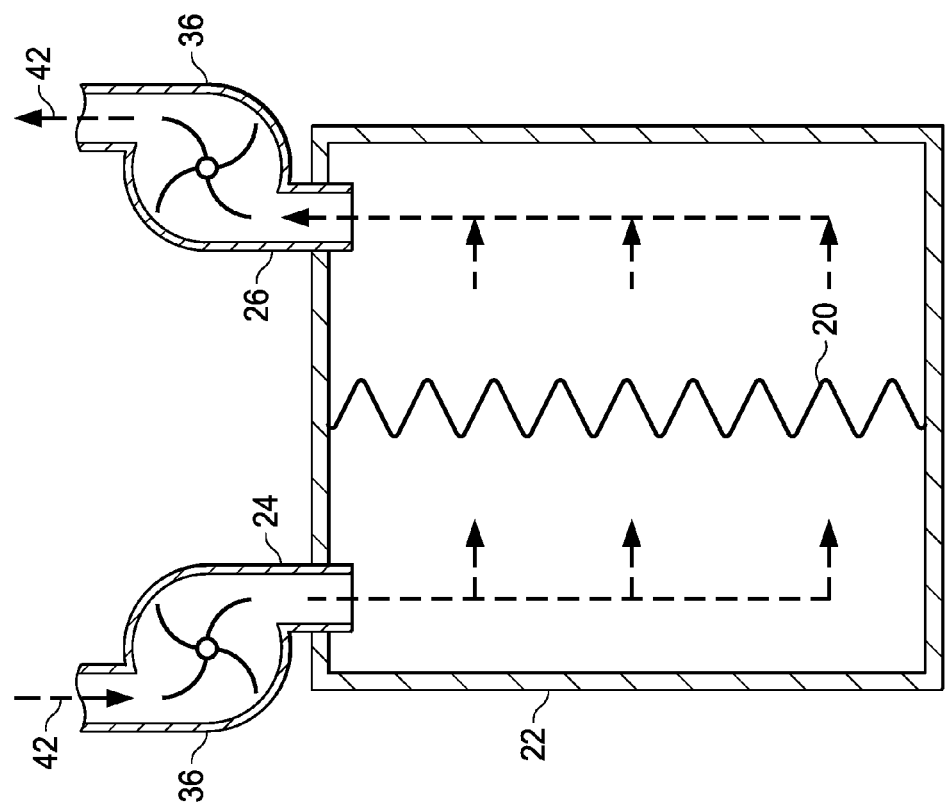
FIG. 11 illustrates the filtering of a chemical using the cleaned membrane.

After membrane 20 is cleaned, the clean membrane 20 is used to filter chemicals, which may be in a liquid or a gaseous form. For example, referring to FIG. 11, chemical 42 is injected into inlet 24, and is retrieved out of outlet 26. When the chemical passes through membrane, the impurities with sizes larger than the pore sizes of membrane 20 are blocked by membrane 20. Accordingly, the cleaned chemical may be retrieved from outlet 26. In some embodiments, the filtered chemical 42 includes photo resist, Bottom Anti-Reflective Coating (BARC), or the like.

Figure 12:
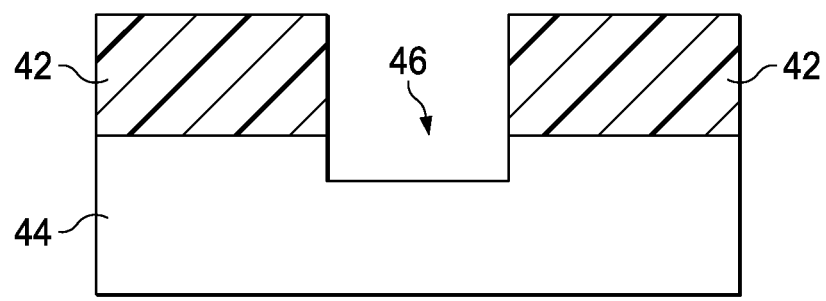
FIG. 12 illustrates performing a photolithography process using a filtered photo resist.

FIG. 12 illustrates an exemplary photolithography process, in which the filtered chemical 42 is used in the manufacturing of integrated circuits. In accordance with some exemplary embodiments, filtered chemical 42 includes a photo resist, which is applied on wafer 44 and then patterned. The patterned photo resist 42 is then used to etch wafer 44, so that trench 46 is formed in wafer 44. Photo resist 42 may then be removed, and further process steps may be performed on wafer 44, including, for example, filling a metal or a dielectric material in trench 46.

In the embodiments of the present disclosure, by using a plurality of solvents in a sequence of cleaning steps, with the solvents having different properties, the efficiency in the cleaning of membrane and housing is improved. In addition, physical forces introduced through two-way cleaning, pressurized cleaning, ultra-sonic cleaning, centrifuge force cleaning, heating, and the like, may also improve the efficiency in the cleaning process.

In accordance with some embodiments, a method includes performing a first cleaning step to clean a membrane, wherein during the first cleaning step, a first solvent passes through the membrane. After the first cleaning step, a second cleaning step is performed to clean the membrane. During the second cleaning step, a second solvent passes through the membrane. The first solvent and the second solvent are in different groups among three solvent groups, wherein the three solvent groups include a non-polar solvent group, a polar aprotic solvent group, and a polar protic solvent group.

In accordance with other embodiments, a method includes performing a cleaning step on a membrane. During the cleaning step, a first solvent passes through the membrane. The cleaning step is selected from the group consisting essentially of a two-way cleaning, an ultra-sonic cleaning, a centrifuge cleaning, a heated cleaning, a pressurized cleaning, and combinations thereof.

In accordance with yet other embodiments, a method includes performing a first cleaning step to clean a membrane. During the first cleaning step, a first solvent passes through the membrane, wherein the first solvent has a first surface tension. After the first cleaning step, a second cleaning step is performed to clean the membrane. During the second cleaning step, a second solvent passes through the membrane. The second solvent has a second surface tension greater than the first surface tension. After the second cleaning step, the membrane is flushed with water.

In accordance with yet other embodiments, a method includes performing a first cleaning step to clean a membrane, and after the first cleaning step, performing a second cleaning step to clean the membrane. During the first cleaning step, a first solvent passes through the membrane to remove a first impurity from the membrane. During the second cleaning step, a second solvent passes through the membrane to remove a second impurity different from the first impurity. The method further includes filtering a photo resist using the cleaned membrane, and performing a photolithography process using the filtered photo resist.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    performing a first cleaning step to clean a membrane, wherein during the first cleaning step, a first solvent passes through the membrane; and
    after the first cleaning step, performing a second cleaning step to clean the membrane, wherein during the second cleaning step, a second solvent passes through the membrane, wherein the first solvent and the second solvent are in different groups among three solvent groups, and wherein the three solvent groups include a non-polar solvent group, a polar aprotic solvent group, and a polar protic solvent group.

2. The method of claim 1 further comprising filtering a photo resist using the membrane, wherein the method further comprises performing a photolithography process using the filtered photo resist.

3. The method of claim 1 further comprising:
    after the second cleaning step, performing a third cleaning step on the membrane, wherein during the third cleaning step, a third solvent passes through the membrane, and wherein the first solvent, the second solvent, and the third solvent are in different groups among the three solvent groups.

4. The method of claim 1 further comprising, after the first and the second cleaning steps, flushing the membrane with water.

5. The method of claim 1, wherein the first solvent is selected from the non-polar solvent group, and the second solvent is selected from the polar aprotic solvent group or the polar protic solvent group, wherein the first solvent and the second solvent have a first polar bonding value and a second polar bonding value, respectively, and wherein a difference between the second polar bonding value and the first polar bonding value is greater than about 5.

6. The method of claim 1, wherein the first solvent is selected from the non-polar solvent group, and the second solvent is selected from the polar aprotic solvent group, wherein the first solvent and the second solvent have a first hydrogen bonding value and a second hydrogen bonding value, respectively, and wherein a difference between the second hydrogen bonding value and the first hydrogen bonding value is greater than about 5.

7. The method of claim 1, wherein the first solvent is selected from the polar aprotic solvent group, and the second solvent is selected from the polar protic solvent group, wherein the first solvent and the second solvent have a first hydrogen bonding value and a second hydrogen bonding value, respectively, and wherein a difference between the second hydrogen bonding value and the first hydrogen bonding value is greater than about 5.

8. The method of claim 1, wherein the first solvent has a first surface tension value smaller than about 30 dyne/cm, and wherein the second solvent has a second surface tension value greater than the first surface tension value.

9. The method of claim 1 further comprising, after the second cleaning step, flushing the membrane using an aqueous solution with a pH value greater than about 8 or smaller than about 6.

10. The method of claim 1 further comprising, increasing a temperature of one of the first solvent and the second solvent to between about 25° C. and about 80° C.

11. A method comprising:
performing a first cleaning step on a membrane, wherein during the first cleaning step, a first solvent passes through the membrane, and wherein the first cleaning step is selected from the group consisting essentially of a two-way cleaning, an ultra-sonic cleaning, a centrifuge cleaning, a heated cleaning, a pressurized cleaning, and combinations thereof.

12. The method of claim 11 further comprising filtering a photo resist using the membrane, wherein the method further comprises performing a photolithography process using the filtered photo resist.

13. The method of claim 11, wherein the first cleaning comprises the two-way cleaning, and wherein the two-way cleaning comprises:
cleaning the membrane by passing the first solvent through the membrane in a first direction; and
cleaning the membrane by passing a second solvent through the membrane in a second direction opposite to the first direction.

14. The method of claim 11, wherein the first cleaning comprises the ultra-sonic cleaning, with an ultra-sonic applied to the first solvent during the ultra-sonic cleaning.

15. The method of claim 11, wherein the first cleaning comprises the centrifuge cleaning, with the membrane and a respective housing holding the membrane therein rotated during the centrifuge cleaning.

16. The method of claim 11, wherein the first cleaning comprises the heated cleaning, wherein the first solvent is heated to a temperature in a range between about 25° C. and about 35° C.

17. The method of claim 11, wherein the first cleaning comprises the pressurized cleaning, wherein a pressure of a housing holding the membrane therein having an inner pressure greater than one atmosphere.

18. The method of claim 11 further comprising:
after the first cleaning step, performing a second cleaning step on the membrane, wherein during the second cleaning step, a second solvent passes through the membrane, wherein the first solvent and the second solvent are in different groups among three solvent groups, and wherein the three solvent groups include a non-polar solvent group, a polar aprotic solvent group, and a polar protic solvent group.

19. A method comprising:
performing a first cleaning step to clean a membrane, wherein during the first cleaning step, a first solvent passes through the membrane to remove a first impurity from the membrane, wherein the first solvent has a first surface tension value; and
after the first cleaning step, performing a second cleaning step to clean the membrane, wherein during the second cleaning step, a second solvent passes through the membrane to remove a second impurity different from the first impurity, wherein the second solvent has a second surface tension value greater than the first surface tension value;
filtering a photo resist using the cleaned membrane; and
performing a photolithography process using the filtered photo resist.

20. The method of claim 19, wherein the first solvent and the second solvent are in different groups among three solvent groups, and wherein the three solvent groups include a non-polar solvent group, a polar aprotic solvent group, and a polar protic solvent group.

* * * * *